United States Patent [19]

Yamamoto

[11] Patent Number: 5,231,879
[45] Date of Patent: Aug. 3, 1993

[54] SEMICONDUCTOR ACCELERATION DETECTING APPARATUS

[75] Inventor: Masahiro Yamamoto, Itami, Japan

[73] Assignee: Mitsubishi Denki Kabushiki Kaisha, Tokyo, Japan

[21] Appl. No.: 846,009

[22] Filed: Mar. 4, 1992

[30] Foreign Application Priority Data

Jun. 28, 1991 [JP] Japan ................................ 3-157957

[51] Int. Cl.$^5$ ............................................. G01P 15/12
[52] U.S. Cl. ................................ 73/517 R; 73/526; 73/516 R; 73/514; 338/46; 257/414; 257/420; 257/415; 257/417
[58] Field of Search .......... 73/517 R, 517 AV, 517 B, 73/526, 516 R, 514; 357/26, 74; 257/414, 420, 415, 417

[56] References Cited

U.S. PATENT DOCUMENTS

| | | | |
|---|---|---|---|
| 3,739,202 | 6/1973 | Cady | 73/517 AV |
| 4,718,275 | 1/1988 | Norling | 73/517 AV |
| 4,785,215 | 11/1988 | Blech | 73/517 AV |
| 4,811,604 | 3/1989 | Browning | 73/517 R |
| 4,941,354 | 7/1990 | Russell et al. | 73/517 B |

FOREIGN PATENT DOCUMENTS 60-205371  10/1985  Japan .

*Primary Examiner*—Eugene R. LaRoche
*Assistant Examiner*—Viet Q. Nguyen
*Attorney, Agent, or Firm*—Leydig, Voit & Mayer

[57] ABSTRACT

The fixed end of an acceleration detection beam of a semiconductor acceleration detecting apparatus is mounted onto a board through a supporting base. A weight for increasing the sensitivity to acceleration is disposed on the free end of the acceleration detection beam. A limit stop for limiting excessive displacement of the weight in two directions surrounds part of the weight. Therefore, the displacement of the weight can be controlled with a high degree of accuracy. Resistance to impact is also improved.

2 Claims, 2 Drawing Sheets

SEMICONDUCTOR ACCELERATION DETECTING APPARATUS

BACKGROUND OF THE INVENTION

1. Field of the Invention

The present invention relates to a semiconductor acceleration detecting apparatus and, in particular, to a semiconductor acceleration detecting apparatus in which resistance to impact is improved.

2. Description of the Related Art

FIG. 3 is a sectional side view showing a conventional semiconductor acceleration detecting apparatus. FIG. 4 is a perspective view thereof. In FIGS. 3 and 4, an acceleration detection beam 1 is mounted on a board 2 by a supporting base 3 mounted on the end of the acceleration detection beam 1. A weight 4 for increasing the sensitivity to acceleration is disposed on the other end of the acceleration detection beam 1. A U-shaped fastener 10 for controlling the upward and downward movement of the weight 4, i.e., the movement in response to acceleration, is mounted on the board 2 below and above this weight 4. A groove 5 faces the board 2 approximately in the middle of the acceleration detection beam 1. Formed on the rear surface of this groove 5 is a strain resistor 6 whose resistance value changes according to the tension and compression thereof. Electrical signals from this strain resistor 6 are transferred to an extraction pin 7 by a conductor 8. The board 2, the acceleration detection beam 1, and the fastener 10 are covered with the lid 9 of an enclosure. FIG. 4 shows a state before the lid 9 is mounted onto the board 2.

With the conventional semiconductor acceleration detecting apparatus constructed as described above, when acceleration is applied to a semiconductor acceleration detecting apparatus, the acceleration detection beam 1, in particular, at the groove 5, flexes. At this time, as the result of the strain resistor 6 disposed on the acceleration detection beam 1 opposite the groove 5, the resistance value of the strain resistor 6 changes. Its output signals are extracted from an extraction pin 7 via the conductor 8, and acceleration is detected. Breakage of the acceleration detection beam 1 due to a large impact is prevented by controlling the upward and downward flexing of the acceleration detection beam 1.

In such a semiconductor acceleration detecting apparatus as described above, when an acceleration other than in a vertical direction is applied, the weight 4 response in that direction. However, the fastener 10 cannot control variations in the position of the weight 4 other than in the vertical direction. Therefore, there is a problem in that the flexing and twisting displacement of the acceleration detection beam 1 cannot be controlled with a high degree of accuracy.

SUMMARY OF THE INVENTION

The present invention has been devised to solve the above-mentioned problems. Accordingly, an object of the present invention is to produce a semiconductor acceleration detecting apparatus for controlling displacements of the weight 4 other than in a vertical direction.

To this end, according to the present invention, there is provided a semiconductor acceleration detecting apparatus comprising: an enclosure board; an enclosure lid covering the board; an acceleration detection beam in which a groove is provided and a strain resistor is formed on the side opposite to the groove; a supporting base by means of which the acceleration detection beam is mounted onto the board at one end thereof and serving as a strut; a weight mounted at the other end of the acceleration detection beam; and a fastener which is mounted on the board surrounding the weight to limit excessive displacement in a direction in which acceleration is applied and in a direction perpendicular to that direction.

DESCRIPTION OF THE PREFERRED EMBODIMENTS

Figure 1:
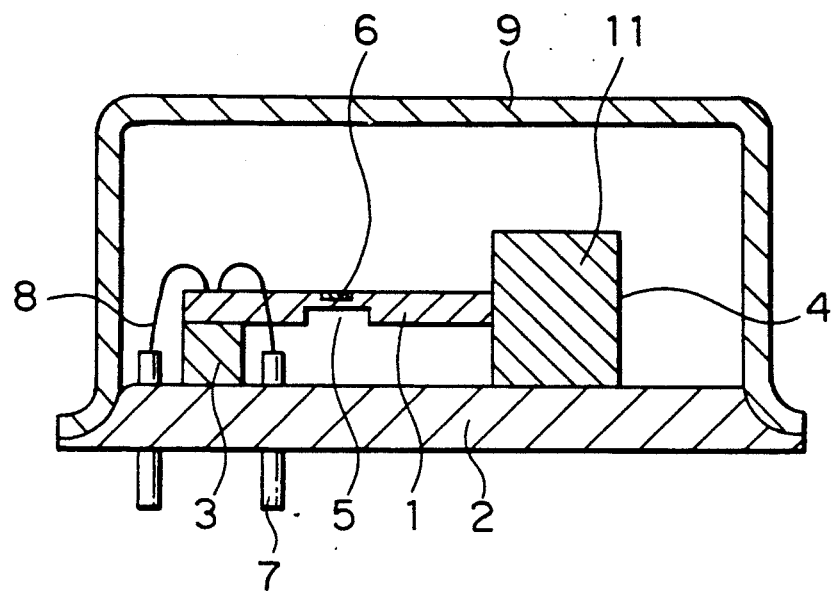
FIG. 1 is a sectional side view showing a semiconductor acceleration detecting apparatus according to an embodiment of the present invention.
Figure 2:
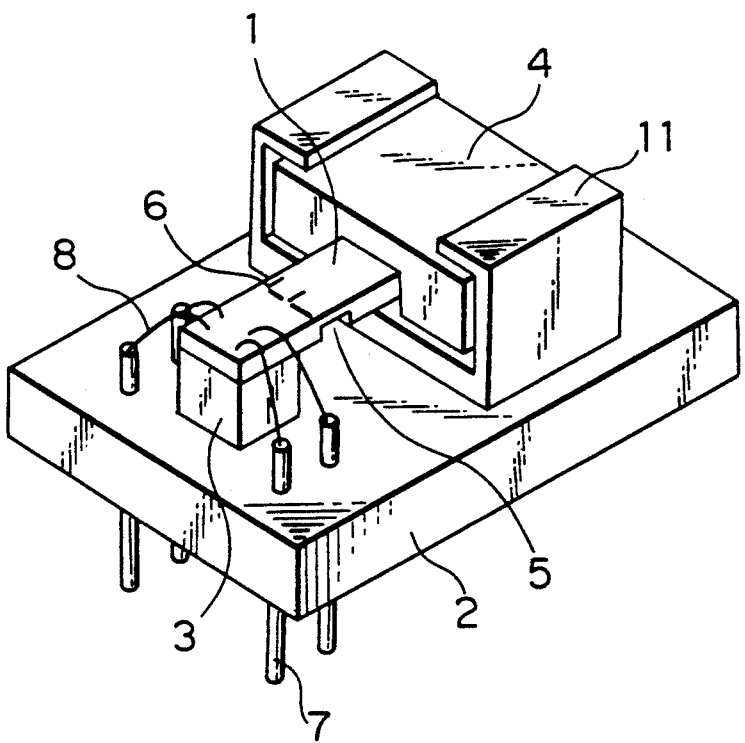
FIG. 2 is a perspective view of the semiconductor acceleration detecting apparatus shown in FIG. 1.
Figure 3:
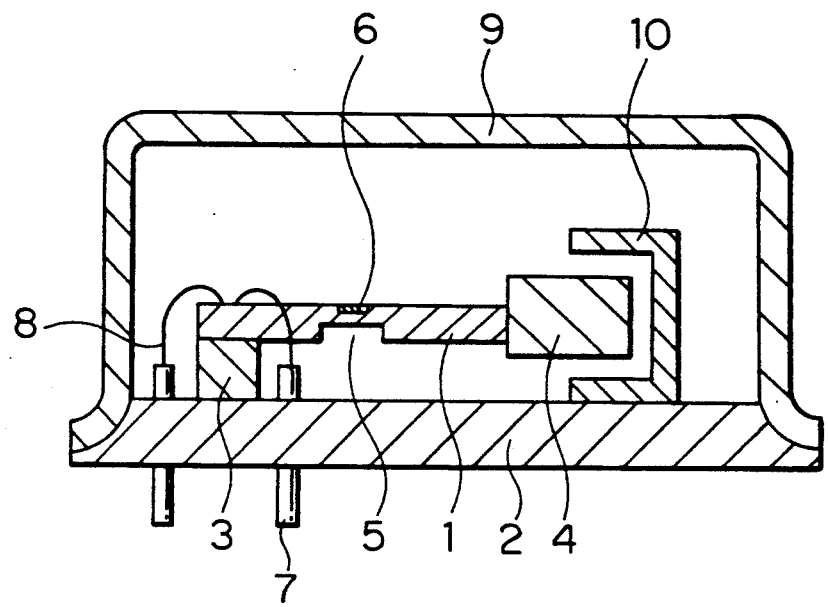
FIG. 3 is a sectional side view showing a conventional semiconductor acceleration detecting apparatus.
Figure 4:
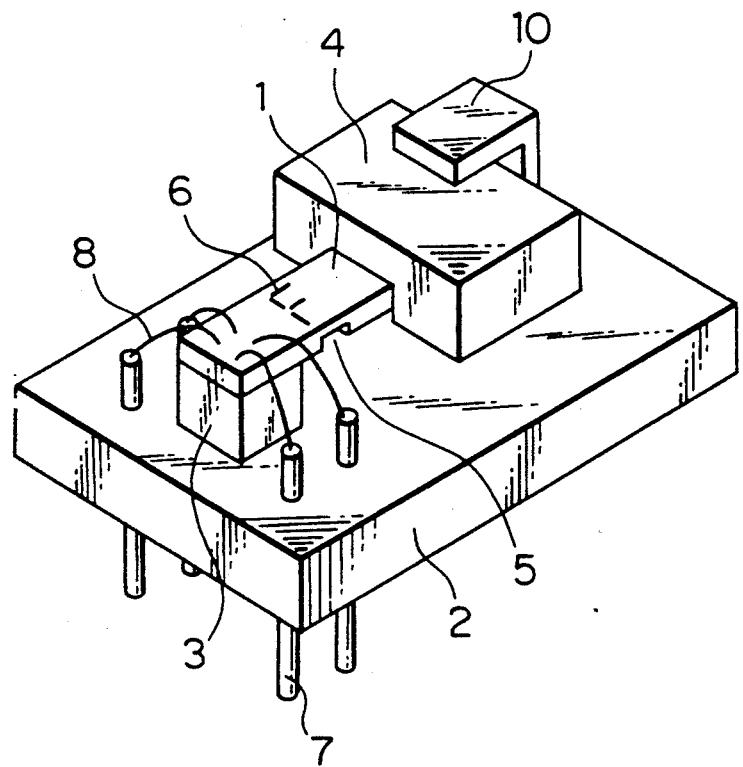
FIG. 4 is a perspective view of the semiconductor acceleration detecting apparatus shown in FIG. 3.

FIG. 1 is a sectional side view showing a semiconductor acceleration detecting apparatus according to an embodiment of the present invention. FIG. 2 is a perspective view of the semiconductor acceleration detecting apparatus shown in FIG. 1. Since the same reference numerals indicate identical or corresponding parts throughout the figures., an explanation thereof is omitted. FIG. 2 shows the apparatus before a lid 9 is mounted onto a board 2. In the present invention, a limit stop 11 for preventing displacement of the beam 1 in a direction in which an acceleration is applied to the acceleration detection beam 1 and in a direction perpendicular to that direction is disposed surrounding the weight 4. The direction perpendicular to the direction in which the acceleration is applied does not include the longitudinal direction of the acceleration detection beam 1.

In the semiconductor acceleration detecting apparatus constructed as described above, if a received acceleration is very large, the acceleration detection beam 1 flexes greatly. In response to the flexing, the weight 4 position varies greatly. However, contact between the limit stop 11 and the weight 4 limits displacement of the weight 4, not only in a direction in which an acceleration is applied but also in a direction perpendicular to that direction. Since the limit stop 11 is mounted on the board 2 after the apparatus has been assembled, it is easy to control the space between the weight 4 and the limit stop 11, and therefore an apparatus having a high degree of accuracy can be obtained.

As has been explained above, according to the present invention, the displacement of a weight can be controlled with a high degree of accuracy. Resistance to impact due to the flexing and twisting of an acceleration detection beam can be controlled with a high degree of accuracy, and an acceleration detecting apparatus having a high degree of accuracy can be advantageously obtained at a low cost.

What is claimed is:

1. A semiconductor acceleration detecting apparatus comprising:

a support board;

a deflectable acceleration detection beam having opposed first and second ends and including a groove between the first and second ends;

a strain resistor disposed on the beam opposite the groove;

a supporting base mounted on the board, the first end of the acceleration detection beam being mounted on the supporting base, the weight being displaced in response to acceleration of the apparatus;

a weight mounted on the second end of the acceleration detection beam; and a limit stop mounted on the board surrounding and spaced from the weight when the apparatus is not subjected to an acceleration for limiting displacement of the weight in response to acceleration of the apparatus in two orthogonal directions.

2. A semiconductor acceleration detecting apparatus comprising:

a support board;

a deflectable cantilevered acceleration detection beam having opposed first and second ends;

a supporting base mounted on the board, the first end of the cantilevered acceleration detection beam being mounted on the supporting base, the weight being displaced in response to acceleration of the apparatus;

a weight mounted on the second end of the cantilevered acceleration detection beam; and a limit stop mounted on the board surrounding and spaced from the weight when the apparatus is not subjected to an acceleration for limiting displacement of the weight in response to acceleration of the apparatus in two orthogonal directions.

* * * * *